United States Patent
Ikawa et al.

(10) Patent No.: US 10,090,285 B2
(45) Date of Patent: Oct. 2, 2018

(54) LIGHT EMITTING MODULE

(71) Applicant: Sharp Kabushiki Kaisha, Sakai, Osaka (JP)

(72) Inventors: Yuta Ikawa, Sakai (JP); Tsuyoshi Ono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 43 days.

(21) Appl. No.: 15/516,718

(22) PCT Filed: Aug. 27, 2015

(86) PCT No.: PCT/JP2015/074247
§ 371 (c)(1),
(2) Date: Apr. 4, 2017

(87) PCT Pub. No.: WO2016/063626
PCT Pub. Date: Apr. 28, 2016

(65) Prior Publication Data
US 2017/0294427 A1    Oct. 12, 2017

(30) Foreign Application Priority Data

Oct. 20, 2014   (JP) .................................. 2014-213695

(51) Int. Cl.
*H01L 25/16* (2006.01)
*F21S 8/04* (2006.01)
(Continued)

(52) U.S. Cl.
CPC .............. *H01L 25/167* (2013.01); *F21S 8/04* (2013.01); *H01L 33/02* (2013.01); *H01L 33/20* (2013.01);
(Continued)

(58) Field of Classification Search
None
See application file for complete search history.

(56) References Cited

U.S. PATENT DOCUMENTS

| | | | |
|---|---|---|---|
| 9,404,646 B2* | 8/2016 | Clark | F21V 21/14 |
| 2005/0265024 A1* | 12/2005 | Luk | F21S 10/02 |
| | | | 362/231 |

(Continued)

FOREIGN PATENT DOCUMENTS

| | | | |
|---|---|---|---|
| JP | 2000-90712 A | 3/2000 | |
| JP | 2008-198905 A | 8/2008 | |

(Continued)

OTHER PUBLICATIONS

Official Communication issued in International Patent Application No. PCT/JP2015/074247, dated Nov. 17, 2015.

(Continued)

*Primary Examiner* — Kenneth B Lee, Jr.
(74) *Attorney, Agent, or Firm* — Keating & Bennett, LLP

(57) ABSTRACT

To provide a light emitting module capable of reducing luminance unevenness. A light emitting module 10 includes an element substrate 11 extending in one direction, and a plurality of LEDs 12 mounted in alignment in a longitudinal direction of the element substrate 11, and an end surface 11a in the longitudinal direction of the element substrate 11 has an inclined surface 11c which is inclined with respect to an end surface 11b in a short side direction.

6 Claims, 5 Drawing Sheets

(51) Int. Cl.
*H01L 33/48* (2010.01)
*H01L 33/02* (2010.01)
*H01L 33/20* (2010.01)
*H01L 33/62* (2010.01)
*F21V 19/00* (2006.01)
*F21Y 113/00* (2016.01)
*F21Y 115/10* (2016.01)
*F21Y 103/20* (2016.01)

(52) U.S. Cl.
CPC ............ *H01L 33/48* (2013.01); *F21V 19/003* (2013.01); *F21Y 2103/20* (2016.08); *F21Y 2113/00* (2013.01); *F21Y 2115/10* (2016.08); *H01L 33/486* (2013.01); *H01L 33/62* (2013.01)

(56) References Cited

U.S. PATENT DOCUMENTS

| | | | | |
|---|---|---|---|---|
| 2009/0002986 A1* | 1/2009 | Medendorp, Jr. | ......... | F21S 8/06 362/247 |
| 2009/0025275 A1* | 1/2009 | Cohnstaedt | ............. | A01M 1/04 43/113 |
| 2009/0244893 A1* | 10/2009 | Villard | ...................... | F21V 3/04 362/246 |
| 2012/0300437 A1* | 11/2012 | Lu | ......................... | F21V 21/005 362/147 |
| 2014/0362574 A1* | 12/2014 | Barrett | ...................... | F21S 2/00 362/249.03 |

FOREIGN PATENT DOCUMENTS

| | | |
|---|---|---|
| JP | 2013-26588 A | 2/2013 |
| JP | 2013-38018 A | 2/2013 |
| JP | 5490951 B1 | 5/2014 |
| JP | 2014-143111 A | 8/2014 |

OTHER PUBLICATIONS

Official Communication issued in International Patent Application No. PCT/JP2015/074247, dated Dec. 20, 2016.
Official Communication issued in International Patent Application No. PCT/JP2015/074247, dated Jul. 26, 2016.

\* cited by examiner

LIGHT EMITTING MODULE

TECHNICAL FIELD

The present invention relates to a light emitting module in which light emitting elements are mounted on an element substrate.

BACKGROUND ART

A conventional light emitting module is disclosed in PTL 1. This light emitting module includes an element substrate having a rectangular shape and a plurality of LEDs (light emitting elements) are mounted in alignment in a predetermined interval in the longitudinal direction on the element substrate. Coupling portions are provided on corner portions on both ends in the longitudinal direction of the element substrate.

A plurality of light emitting modules are arranged side by side in an annular shape with their longitudinal directions constituting the circumferential direction in a plan view, in a housing which has a cylindrical shape and is attached on a ceiling surface in a living space. At this time, the light emitting modules adjacent to each other are coupled by the coupling portions. Further, one light emitting module is connected to a power source. Thus, a lighting system installed on a ceiling surface is configured.

When power is supplied to one light emitting module, the power is supplied also to other light emitting modules via the coupling portions, emitting light from the LEDs of each of the light emitting modules. Accordingly, light distribution in a substantially circular shape can be obtained to be able to illuminate a living space.

CITATION LIST

Patent Literature

PTL 1: Japanese Unexamined Patent Application Publication No. 2013-38018 (pp. 7-10, FIG. 2, FIG. 4)

SUMMARY OF INVENTION

Technical Problem

However, when a plurality of conventional light emitting modules mentioned above are arranged side by side in an annular shape in a plan view, a distance between adjacent LEDs between different light emitting modules is longer than a distance between adjacent LEDs in one light emitting module. This causes a problem in which luminance in a region between adjacent light emitting modules is lower than luminance in a light emitting module and thus, luminance unevenness of a lighting system is generated.

An object of the present invention is to provide a light emitting module which is capable of reducing luminance unevenness.

Solution to Problem

In order to attain the above-mentioned object, a light emitting module according to the present invention is characterized in that the light emitting module includes an element substrate extending in one direction, and a plurality of light emitting elements mounted in alignment in a longitudinal direction of the element substrate, and an end surface in the longitudinal direction of the element substrate has an inclined surface which is inclined with respect to an end surface in a short side direction.

Further, it is preferable that the inclined surfaces which are respectively formed on both end surfaces in the longitudinal direction have mutually different inclination angles with respect to the end surface in the short side direction, in the light emitting module having the above-mentioned configuration, in the present invention.

Further, it is preferable that one end surface in the longitudinal direction has a plurality of the inclined surfaces which have mutually different inclination angles with respect to the end surface in the short side direction, in the light emitting module having the above-mentioned configuration, in the present invention.

Further, it is preferable that the inclined surface is composed of a curved surface, in the light emitting module having the above-mentioned configuration, in the present invention.

Further, it is preferable that the inclined surface is formed continuously to an orthogonal surface, which is orthogonal to the end surface in the short side direction, and a length of the orthogonal surface in the short side direction is longer than a length of the inclined surface in the short side direction, in the light emitting module having the above-mentioned configuration, in the present invention.

Further, it is preferable that a circular hole and an elongated hole for screwing are formed in juxtaposition in the longitudinal direction of the element substrate and a male connector and a female connector are provided respectively to one end portion and the other end portion in the longitudinal direction of the element substrate, in the light emitting module having the above-mentioned configuration, in the present invention.

The present invention is characterized in that the inclined surface is in close proximity to the adjacent element substrate in a lighting system in which a plurality of light emitting modules having the above-mentioned configuration are arranged in an annular shape.

Further, in the present invention, it is preferable that the light emitting elements are mounted on the element substrate in a predetermined interval and a distance between the adjacent light emitting elements between the light emitting modules different from each other is approximately equal to the interval in the lighting system having the above-mentioned configuration.

Advantageous Effects of Invention

According to the light emitting module of the present invention, the light emitting module includes a plurality of light emitting elements mounted in alignment in the longitudinal direction of the element substrate and an end surface in the longitudinal direction of the element substrate has an inclined surface which is inclined with respect to an end surface in a short side direction. Accordingly, when a plurality of light emitting modules are arranged in an annular shape with their longitudinal directions constituting the circumferential direction, for example, a distance between adjacent light emitting elements between different light emitting modules can be reduced compared to the case of an element substrate having a rectangular shape. Accordingly, luminance degradation in a region between different light emitting modules can be prevented and luminance unevenness of the lighting system including light emitting modules can be reduced.

DESCRIPTION OF EMBODIMENTS

First Embodiment

Figure 1:
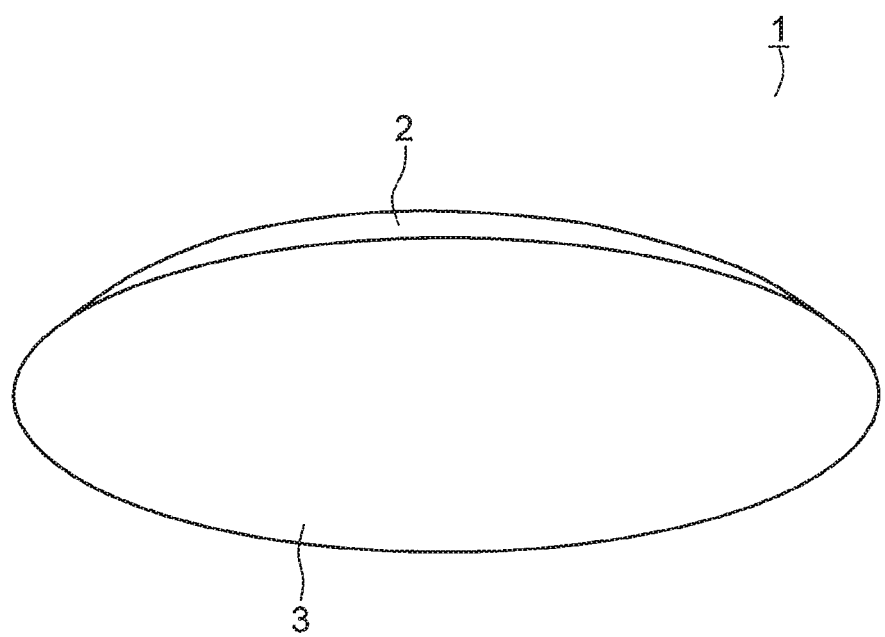
FIG. 1 is a perspective view illustrating a lighting system including light emitting modules according to a first embodiment of the present invention.
Figure 2:
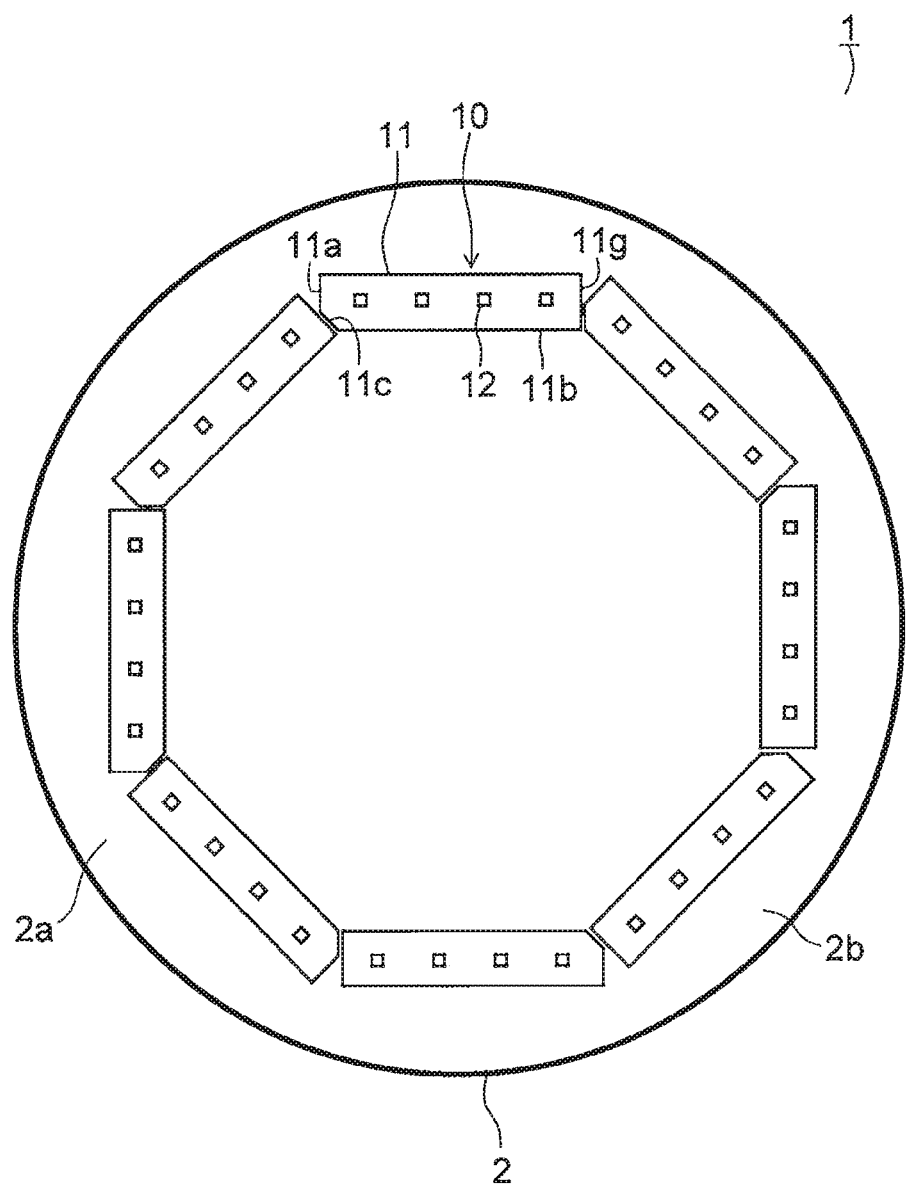
FIG. 2 is a plan view illustrating the lighting system including light emitting modules according to the first embodiment of the present invention.

Embodiments according to the present invention will be described below with reference to the accompanying drawings. FIG. 1 and FIG. 2 are respectively a perspective view and a plan view illustrating a lighting system including light emitting modules according to the first embodiment. Here, FIG. 2 illustrates a state in which a lamp cover 3 is detached. The lighting system 1 is a ceiling light which is attached to a ceiling surface in a living space and includes a housing 2 having a bottomed cylindrical shape and including an opening portion 2a and a plurality of light emitting modules 10 which are arranged on a bottom surface 2b of the housing 2. The opening portion 2a is closed by the lamp cover 3 which is made of translucent resin and has a circular shape. The lamp cover 3 is detachable with respect to the housing 2. By attaching the housing 2 on a ceiling surface of a living space, the lighting system 1 is installed on the ceiling surface.

Figure 3:
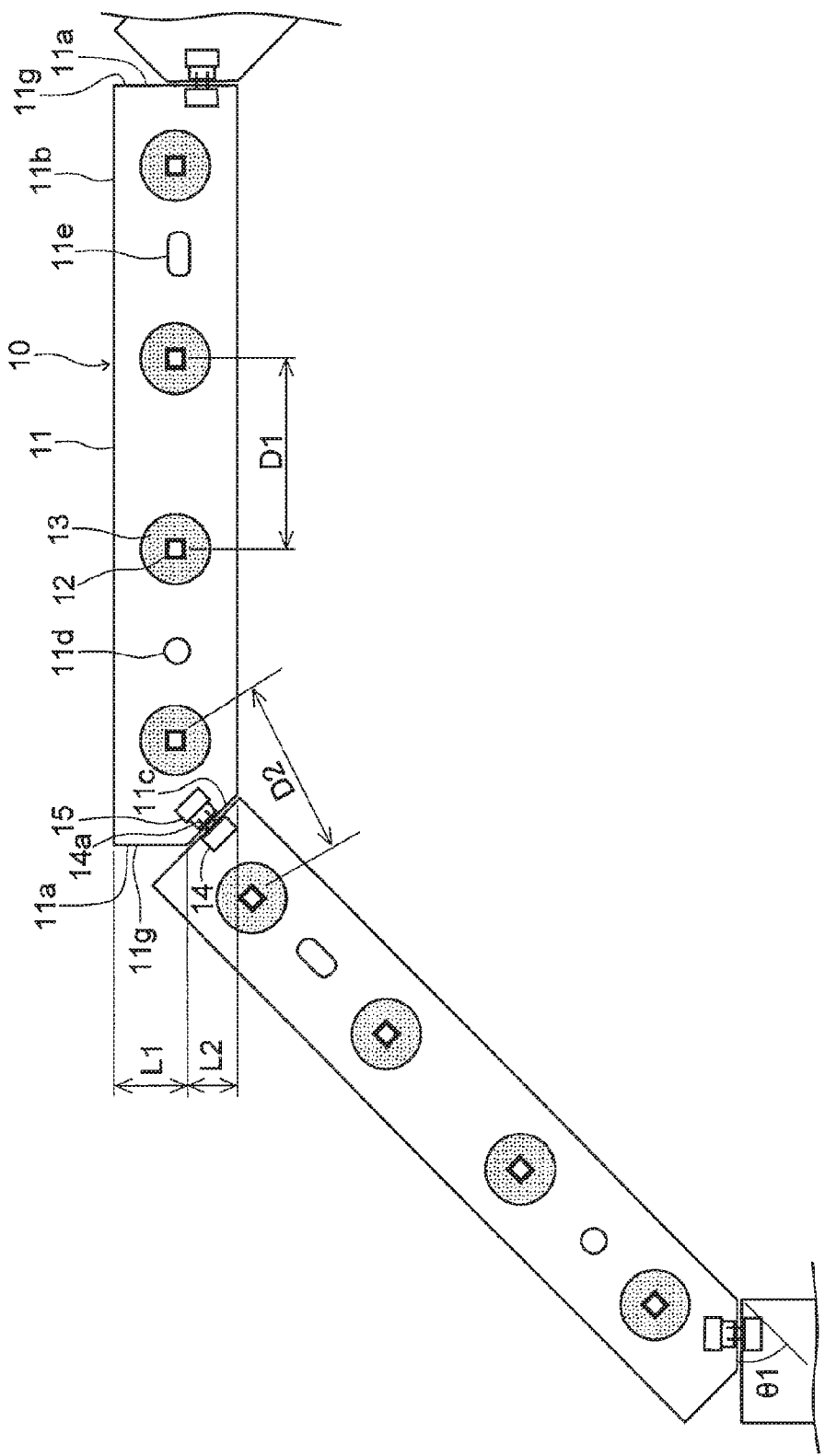
FIG. 3 is a plan view illustrating the light emitting modules according to the first embodiment of the present invention.

FIG. 3 is a plan view illustrating the light emitting modules 10. The light emitting module 10 includes an element substrate 11 extending in one direction and a plurality of LEDs 12 (light emitting elements) mounted in alignment in the longitudinal direction of the element substrate 11 in a predetermined interval D1. The element substrate 11 is formed with a printed wiring substrate made of epoxy resin, for example. One end surface 11a in the longitudinal direction of the element substrate 11 has an inclined surface 11c which is inclined with respect to an end surface 11b in the short side direction and the other end surface 11a in the longitudinal direction is composed of an orthogonal surface 11g which is orthogonal to the end surface 11b.

The inclined surface 11c is composed of a plain surface and is formed so that the inclination angle θ1 with respect to the end surface 11b is 45°. The inclined surface 11c is formed continuously to the orthogonal surface 11g which is orthogonal to the end surface 11b. The length L1 of the orthogonal surface 11g in the short side direction of the element substrate 11 is longer than the length L2 of the inclined surface 11c in the short side direction of the element substrate 11. Accordingly, a sufficient space for mounting the LEDs 12, and a male connector 14 and a female connector 15 which will be described later can be secured on the element substrate 11 even though the inclined surface 11c is formed.

In the longitudinal direction of the element substrate 11, a circular hole 11d which penetrates and an elongated hole 11e which penetrates are formed in juxtaposition. Screws (not shown) are inserted into the circular hole 11d and the elongated hole 11e so as to screw the element substrate 11 to the bottom surface 2b (see FIG. 2) of the housing 2. At this time, the screw is loosely fitted to the elongated hole 11e.

The LED 12 is formed such that fluorescent paint containing phosphors which convert blue light into yellow light is applied on a surface of a blue light emitting diode chip which emits blue light in a monochromatic manner, for example. Accordingly, part of blue light emitted from the LED 12 is converted into yellow light and thus the blue light and the yellow light are mixed to be emitted as white light. Further, the distance D2 between adjacent LEDs 12 between different light emitting modules 10 is approximately equal to the interval D1.

Further, a diffusion lens 13 is disposed on an emission surface side of the LED 12. The diffusion lens 13 is capable of expanding light distribution of light emitted from the LED 12.

On one end portion and the other end portion in the longitudinal direction of the element substrate 11, the male connector 14 and the female connector 15 are respectively attached. The male connector 14 has a plug portion 14a and is attached in the vicinity of the orthogonal surface 11g on the end surface 11a which does not have the inclined surface 11c. The female connector 15 has a socket portion (not shown), into which the plug portion 14a is inserted, and is attached in the vicinity of the inclined surface 11c.

The light emitting modules 10 are coupled to each other such that the orthogonal surface 11g on the end surface 11a which does not have the inclined surface 11c of the light emitting module 10 is brought close to the inclined surface 11c of another light emitting module 10 in an opposed manner and the plug portion 14a of the male connector 14 is inserted into the socket portion of the female connector 15. Accordingly, eight pieces of light emitting modules 10 are arranged in a substantially regular octagonal shape with their longitudinal directions constituting the circumferential direction in a plan view, as illustrated in FIG. 2.

At this time, the element substrate 11 of one light emitting module 10 is connected to a power source circuit (not shown). Here, the element substrate 11 of each of the light emitting modules 10 may be connected to the power source circuit. In this case, the male connector 14 and the female connector 15 may be omitted from the light emitting module 10.

Further, instead of the male connector 14 and the female connector 15, the light emitting modules 10 adjacent to each other may be coupled by a wire (not shown). In this case, the light emitting modules 10 adjacent to each other are coupled by soldering a metal wire material on lands of the element substrates 11. Accordingly, in the case where thermal expansion of the element substrate 11 occurs due to heat generation of the LED 12 as described later, the wire material bends and thus absorbs stress. Here, the light emitting modules 10 adjacent to each other may be coupled by a harness cable having a connector. Alternatively, the light emitting modules 10 adjacent to each other may be coupled by connecting a single-core cable, for example, to connectors provided on lands of the element substrates 11.

In the lighting system 1 having the above-described configuration, when power is supplied to one light emitting module 10 from a power source circuit, the power is supplied also to other light emitting modules 10 via the male connectors 14 and the female connectors 15. Accordingly, the LEDs 12 of each of the light emitting modules 10 emit white light to illuminate a living space.

At this time, a plurality of (eight pieces in the present embodiment) light emitting modules 10 are arranged side by side in a substantially regular octagonal shape with their longitudinal directions constituting the circumferential direction in a plan view, being able to provide light distribution in a substantially circular shape. Further, the inclined surface 11*c* is in close proximity to the orthogonal surface 11*g* of the adjacent element substrate 11, being able to prevent degradation of luminance in a region between the light emitting modules 10 adjacent to each other. Accordingly, luminance unevenness of the lighting system 1 can be reduced, being able to illuminate an inside of a living space almost uniformly.

Here, eight pieces of light emitting modules 10 are arranged side by side in a substantially regular octagonal shape in a plan view in the present embodiment. However, when the inclined surface 11*c* is formed to have the inclination angle θ1 of 30°, 54°, or 60°, for example, the light emitting modules 10 can be arranged side by side in a substantially regular hexagonal shape, a substantially regular decagonal shape, or a substantially regular dodecagonal shape respectively. That is, when the following formula (1) is satisfied, n pieces of light emitting modules 10 can be arranged in a substantially regular n-polygonal shape in a plan view. Accordingly, a plurality of light emitting modules 10 can be arranged in an annular shape while preventing luminance unevenness.

$$\theta 1=90-360/n \quad (1)$$

When the light emitting module 10 is energized, the element substrate 11 thermally expands due to heat generation of the LEDs 12. Then, when the energization to the light emitting module 10 is ended, the element substrate 11 which has thermally expanded shrinks to be in the original size. At this time, since a screw is loosely fitted to the elongated hole 11*e*, the element substrate 11 extends in the longitudinal direction of the element substrate 11 which is the same direction as the extraction/insertion direction of the plug portion 14*a* of the male connector 14. Accordingly, a dimensional error between the male connector 14 and the female connector 15 can be absorbed and conduction between the male connector 14 and the female connector 15 can be maintained.

According to the present embodiment, the end surface 11*a* in the longitudinal direction of the element substrate 11 has the inclined surface 11*c* which is inclined with respect to the end surface 11*b* in the short side direction. Accordingly, when a plurality of light emitting modules 10 are arranged in an annular shape with their longitudinal directions constituting the circumferential direction in a plan view, a distance between adjacent LEDs 12 (light emitting elements) between different light emitting modules 10 can be reduced compared to the case of an element substrate having a rectangular shape. Consequently, luminance degradation in a region between different light emitting modules 10 can be prevented and luminance unevenness of the lighting system 1 can be reduced.

Further, the inclined surface 11*c* is formed continuously to the orthogonal surface 11*g* which is orthogonal to the end surface 11*b* in the short side direction of the element substrate 11 and the length L1 of the orthogonal surface 11*g* in the short side direction of the element substrate 11 is longer than the length L2 of the inclined surface 11*c* in the short side direction of the element substrate 11. Accordingly, a sufficient space for arranging the LEDs 12, the male connector 14, the female connector 15, and the like can be secured on the element substrate 11 even though the inclined surface 11*c* is provided.

Further, the circular hole 11*d* and the elongated hole 11*e* for screwing are formed in juxtaposition in the longitudinal direction of the element substrate 11, and the male connector 14 and the female connector 15 are provided respectively to one end portion and the other end portion in the longitudinal direction of the element substrate 11. Accordingly, in the case of thermal expansion or shrinkage of the element substrate 11, a dimensional error between the male connector 14 and the female connector 15 can be absorbed and conduction between the male connector 14 and the female connector 15 can be maintained.

Further, the inclined surface 11*c* is in close proximity to the adjacent element substrate 11, so that a distance between adjacent LEDs 12 between different light emitting modules 10 can be easily reduced.

Further, the LEDs 12 (light emitting elements) are mounted on the element substrate 11 in a predetermined interval D1 and the distance D2 between adjacent LEDs 12 between different light emitting modules 10 is approximately equal to the interval D1. Accordingly, luminance unevenness of the lighting system 1 can be easily reduced.

Here, the distance D2 may be shorter than the interval D1. The male connector 14 and the female connector 15 are disposed respectively on one end portion and the other end portion in the longitudinal direction of the element substrate 11, so that the male connector 14 and the female connector 15 are irradiated with part of emitted light of the LED 12 provided on the end portion in the longitudinal direction of the element substrate 11. Accordingly, even if the distance D2 is shorter than the interval D1, luminance in a region between adjacent light emitting modules 10 hardly becomes larger than luminance in the light emitting module 10. Consequently, luminance unevenness of the lighting system 1 can be easily reduced in this case as well.

Second Embodiment

Figure 4:
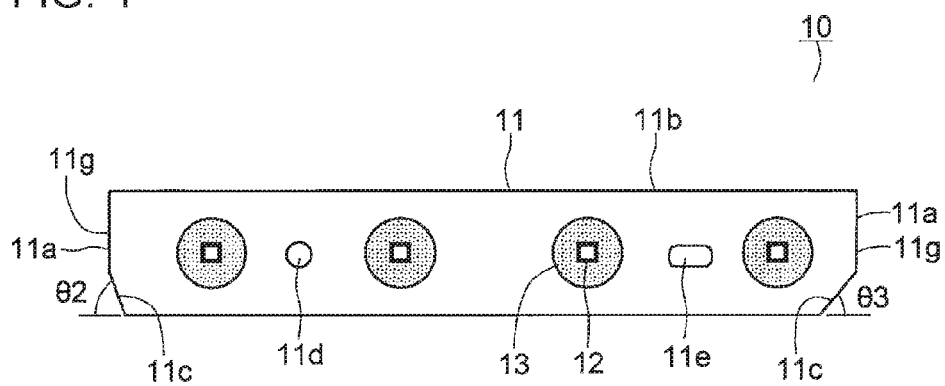
FIG. 4 is a plan view illustrating a light emitting module according to a second embodiment of the present invention.

The second embodiment according to the present invention will now be described. FIG. 4 is a plan view illustrating a light emitting module according to the present embodiment. Portions same as those in the above-described first embodiment illustrated in FIGS. 1 to 3 are denoted with the same reference characters for convenience in explanation. The present embodiment is different from the first embodiment in that an inclined surface 11*c* is formed on both end surfaces 11*a* in the longitudinal direction of the element substrate 11. Other portions are the same as those of the first embodiment.

On both end surfaces 11*a* in the longitudinal direction of the element substrate 11, inclined surfaces 11*c* whose inclination angles θ2 and θ3 with respect to the end surface 11*b* in the short side direction are respectively 70° and 50° are respectively formed. That is, the inclination angles of two inclined surfaces 11*c* are different from each other. However, the inclination angles θ2 and θ3 may be the same as each other.

The orthogonal surface 11*g* continuing to the inclined surface 11*c* having the inclination angle θ3 and the inclined surface 11*c* having the inclination angle θ2 can be brought close to each other in an opposed manner so as to arrange 18 pieces of light emitting modules 10 in a substantially regular octadecagonal shape in a plan view. Further, the orthogonal surface 11*g* continuing to the inclined surface 11*c* having the inclination angle θ2 and the inclined surface 11*c* having the inclination angle θ3 can be brought close to each other in an opposed manner so as to arrange nine pieces of light emitting modules 10 in a substantially regular nonagonal shape in a plan view.

Further, the inclined surface 11c having the inclination angle θ2 and the inclined surface 11c having the inclination angle θ3 can be brought close to each other in an opposed manner so as to arrange six pieces of light emitting modules 10 in a substantially regular hexagonal shape in a plan view. That is, when the following formula (2) is satisfied, n pieces of light emitting modules 10 can be arranged in a substantially regular n-polygonal shape in a plan view. Accordingly, a plurality of light emitting modules 10 can be arranged in an annular shape while preventing luminance unevenness.

$$\theta 2+\theta 3=180-360/n \qquad (2)$$

According to the present embodiment, advantageous effects similar to those of the first embodiment can be obtained. Further, the inclined surfaces 11c respectively formed on both end surfaces 11a in the longitudinal direction of the element substrate 11 have mutually different inclination angles with respect to the end surface 11b in the short side direction. Accordingly, the element substrate 11 can be shared among a plurality of kinds of lighting systems 1 which mutually have different arrangement of the light emitting modules 10. Consequently, a manufacturing cost of the lighting system 1 can be reduced.

Third Embodiment

Figure 5:
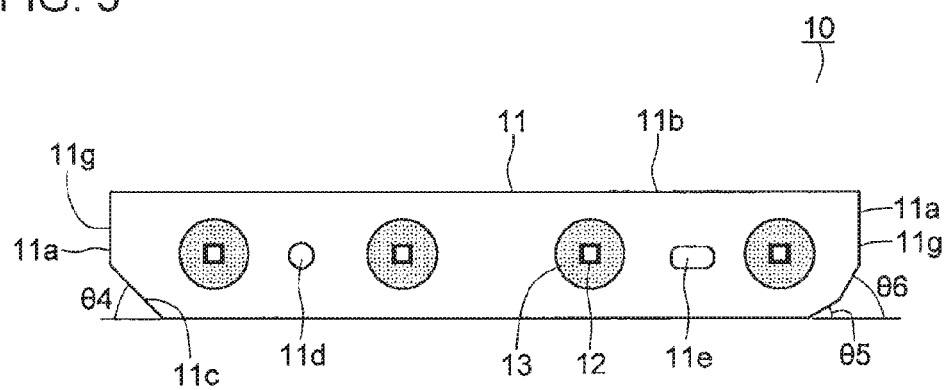
FIG. 5 is a plan view illustrating a light emitting module according to a third embodiment of the present invention.

The third embodiment according to the present invention will now be described. FIG. 5 is a plan view illustrating a light emitting module according to the present embodiment. Portions same as those in the above-described first embodiment illustrated in FIGS. 1 to 3 are denoted with the same reference characters for convenience in explanation. The present embodiment is different from the first embodiment in that an inclined surface 11c is formed on both end surfaces 11a in the longitudinal direction of the element substrate 11 and a plurality of inclined surfaces 11c are formed on one end surface 11a. Other portions are the same as those of the first embodiment.

One end surface 11a in the longitudinal direction of the element substrate 11 has inclined surfaces 11c whose inclination angles θ5 and θ6 with respect to the end surface 11b in the short side direction are respectively 30° and 60°, and the other end surface 11a in the longitudinal direction has an inclined surface 11c whose inclination angle θ4 is 45°.

The orthogonal surface 11g continuing to the inclined surface 11c having the inclination angle θ6 and the inclined surface 11c having the inclination angle θ4 can be brought close to each other in an opposed manner so as to arrange eight pieces of light emitting modules 10 in a substantially regular octagonal shape in a plan view. Further, the orthogonal surface 11g continuing to the inclined surface 11c having the inclination angle θ4 and the inclined surface 11c having the inclination angle θ5 can be brought close to each other in an opposed manner so as to arrange six pieces of light emitting modules 10 in a substantially regular hexagonal shape in a plan view. Further, the orthogonal surface 11g continuing to the inclined surface 11c having the inclination angle θ4 and the inclined surface 11c having the inclination angle θ6 can be brought close to each other in an opposed manner so as to arrange 12 pieces of light emitting modules 10 in a substantially regular dodecagonal shape in a plan view.

According to the present embodiment, advantageous effects similar to those of the first embodiment can be obtained. Further, one end surface 11a in the longitudinal direction of the element substrate 11 has a plurality of inclined surfaces 11c which mutually have different inclination angles with respect to the end surface 11b on the short side direction. Accordingly, the element substrate 11 can be shared among a plurality of kinds of lighting systems 1 which have mutually different arrangement of the light emitting modules 10. Consequently, a manufacturing cost of the lighting system 1 can be reduced.

Here, in the present embodiment, both of the end surfaces 11a in the longitudinal direction of the element substrate 11 may have a plurality of inclined surfaces 11c which have mutually different inclination angles with respect to the end surface 11b on the short side direction.

Fourth Embodiment

Figure 6:
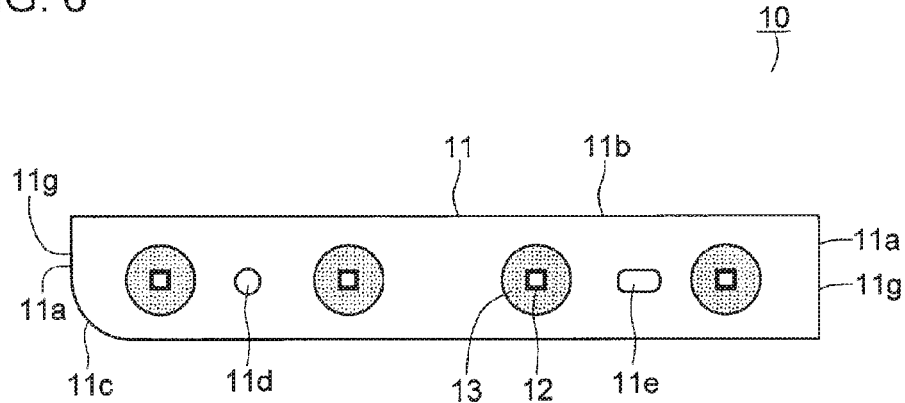
FIG. 6 is a plan view illustrating a light emitting module according to a fourth embodiment of the present invention.

The fourth embodiment according to the present invention will now be described. FIG. 6 is a plan view illustrating a light emitting module 10 according to the present embodiment. Portions same as those in the above-described first embodiment illustrated in FIGS. 1 to 3 are denoted with the same reference characters for convenience in explanation. In the present embodiment, a shape of an inclined surface 11c is different from that of the first embodiment. Other portions are the same as those of the first embodiment.

One end surface 11a in the longitudinal direction of the element substrate 11 has an inclined surface 11c which is composed of a curved surface. The inclined surface 11c which is a curved surface and the orthogonal surface 11g can be brought close to each other in an opposed manner so as to arrange a plurality of light emitting modules 10 in an annular shape in a plan view.

Here, both of the end surfaces 11a in the longitudinal direction of the element substrate 11 may respectively have inclined surfaces 11c composed of a curved surface. In this case, the inclined surfaces 11c which are curved surfaces can be brought close to each other in an opposed manner so as to arrange a plurality of light emitting modules 10 in an annular shape in a plan view, as well.

According to the present embodiment, advantageous effects similar to those of the first embodiment can be obtained. Further, the inclined surface 11c is composed of a curved surface, so that a wide variety of layouts of the light emitting modules 10 can be easily realized while reducing luminance unevenness of the lighting system 1, compared to the case of the inclined surface 11c composed of a plane surface. Further, the element substrate 11 can be shared among a plurality of kinds of lighting systems 1 which have mutually different arrangement of the light emitting modules 10. Accordingly, a manufacturing cost of the lighting system 1 can be reduced.

Fifth Embodiment

Figure 7:
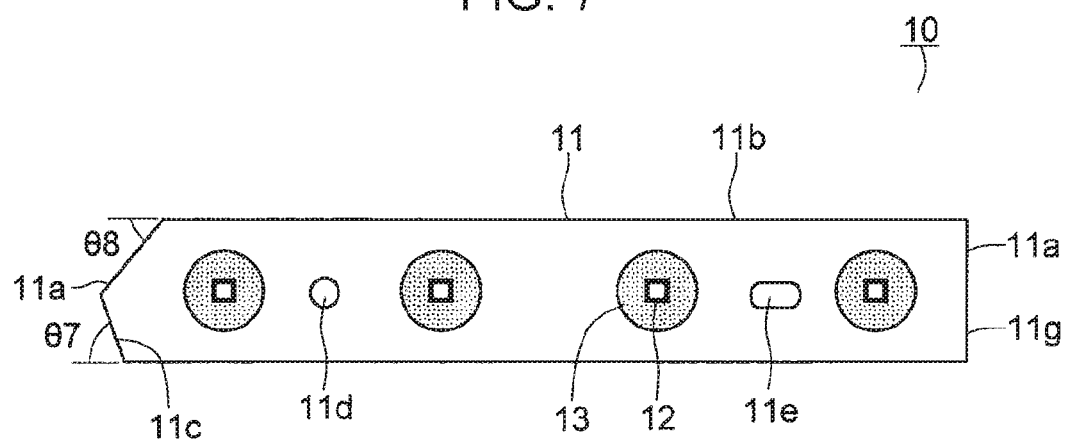
FIG. 7 is a plan view illustrating a light emitting module according to a fifth embodiment of the present invention.

The fifth embodiment according to the present invention will now be described. FIG. 7 is a plan view illustrating a light emitting module 10 according to the present embodiment. Portions same as those in the above-described first embodiment illustrated in FIGS. 1 to 3 are denoted with the same reference characters for convenience in explanation. The present embodiment is different from the first embodiment in that one end surface 11a in the longitudinal direction of the element substrate 11 is composed of inclined surfaces 11c. Other portions are the same as those of the first embodiment.

One end surface 11a in the longitudinal direction of the element substrate 11 is composed of inclined surfaces 11c respectively having inclination angles θ7 and θ8 and the orthogonal surface 11g is omitted. The inclination angles θ7 and θ8 are respectively set as 70° and 50°.

The inclined surface 11c having the inclination angle θ7 and the orthogonal surface 11g can be brought close to each other in an opposed manner so as to arrange 18 pieces of light emitting modules 10 in a substantially regular octadecagonal shape in a plan view. Further, the inclined surface 11c having the inclination angle θ8 and the orthogonal surface 11g can be brought close to each other in an opposed manner so as to arrange nine pieces of light emitting modules 10 in a substantially regular nonagonal shape in a plan view.

According to the present embodiment, advantageous effects similar to those of the first embodiment can be obtained. Further, the element substrate 11 can be shared among a plurality of kinds of lighting systems 1 which have mutually different arrangement of the light emitting modules 10. Accordingly, a manufacturing cost of the lighting system 1 can be reduced.

Here, in the present embodiment, one end surface 11a in the longitudinal direction of the element substrate 11 is composed of a plurality of inclined surfaces 11c having inclination angles different from each other, but one end surface 11a may be composed of one inclined surface 11c. Further, both of the end surfaces 11a in the longitudinal direction of the element substrate 11 may be composed of inclined surfaces 11c and thus, the orthogonal surface 11g may be omitted.

The lighting system 1 has been described by taking the ceiling light as an example in the first to fifth embodiments, but light emitting modules 10 may be arranged in a stand light which is disposed on a desk, a floor, or the like, a back light of a liquid crystal display device, or an outdoor lighting system, for example.

INDUSTRIAL APPLICABILITY

The present invention is applicable to a light emitting module including an element substrate on which light emitting elements are mounted.

REFERENCE SIGNS LIST 1 lighting system
2 housing
3 lamp cover
10 light emitting module
11 element substrate
11a, 11b end surface
11c inclined surface
11d circular hole
11e elongated hole
11g orthogonal surface
12 LED (light emitting element)
13 diffusion lens
14 male connector
15 female connector

The invention claimed is:

1. A light emitting module comprising:
an element substrate extending in one direction; and
a plurality of light emitting elements mounted in a straight line aligned with a longitudinal direction of the element substrate, wherein
both end surfaces of the element substrate in the longitudinal direction have a plurality of inclined surfaces which are inclined with respect to end surfaces of the element substrate in a short side direction thereof,
the inclined surfaces are each formed continuously with the end surfaces, adjacent thereto, of the element substrate in the short side direction,
the inclined surfaces respectively have mutually different inclination angles with respect to the end surfaces of the element substrate in the short side direction, and
the element substrate comprises a plurality of element substrates arranged with the respective end surfaces thereof in the longitudinal direction having mutually different inclination angles brought close together in an opposed manner.

2. The light emitting module according to claim 1, wherein the inclination angles are obtuse angles.

3. The light emitting module according to claim 1, wherein of one or both of the end surfaces of the element substrate in the longitudinal direction, one of the inclined surfaces is formed continuously with another of the inclined surfaces.

4. The light emitting module according to claim 2, wherein of one or both of the end surfaces of the element substrate in the longitudinal direction, one of the inclined surfaces is formed continuously with another of the inclined surfaces.

5. The light emitting module according to claim 1, wherein the inclined surfaces are formed continuously with an orthogonal surface, the orthogonal surface being orthogonal to the end surfaces of the element substrate in the short side direction, and a length of the orthogonal surface in the short side direction is larger than a length of the inclined surfaces in the short side direction.

6. The light emitting module according to claim 2, wherein the inclined surfaces are formed continuously with an orthogonal surface, the orthogonal surface being orthogonal to the end surfaces of the element substrate in the short side direction, and a length of the orthogonal surface in the short side direction is larger than a length of the inclined surfaces in the short side direction.

* * * * *